US009312395B2

(12) United States Patent
Seol et al.

(10) Patent No.: US 9,312,395 B2
(45) Date of Patent: Apr. 12, 2016

(54) THIN-FILM TRANSISTOR, METHOD OF MANUFACTURING THE SAME, AND METHOD OF MANUFACTURING BACKPLANE FOR FLAT PANEL DISPLAY

(71) Applicants: Samsung Display Co., Ltd., Yongin, Gyeonggi-Do (KR); University-Industry Cooperation Group of Kyung Hee University, Seoul (KR)

(72) Inventors: Young-Gug Seol, Yongin (KR); Tae-Woong Kim, Yongin (KR); Jin Jang, Seoul (KR); Christophe Avis, Seoul (KR)

(73) Assignees: Samsung Display Co., Ltd. (KR); University-Industry Cooperation Group of Kyung Hee University (KR)

( * ) Notice: Subject to any disclaimer, the term of this patent is extended or adjusted under 35 U.S.C. 154(b) by 0 days.

(21) Appl. No.: 14/339,232

(22) Filed: Jul. 23, 2014

(65) Prior Publication Data

US 2015/0028331 A1  Jan. 29, 2015

(30) Foreign Application Priority Data

Jul. 26, 2013 (KR) ........................ 10-2013-0088971

(51) Int. Cl.
*H01L 21/16* (2006.01)
*H01L 29/786* (2006.01)
*H01L 27/12* (2006.01)
(Continued)

(52) U.S. Cl.
CPC ...... *H01L 29/78693* (2013.01); *H01L 27/1225* (2013.01); *H01L 29/4908* (2013.01); *H01L 29/66969* (2013.01)

(58) Field of Classification Search
CPC .................. H01L 29/78693; H01L 27/1225; H01L 27/1259
See application file for complete search history.

(56) References Cited

U.S. PATENT DOCUMENTS

| 2009/0166616 | A1 | 7/2009 | Uchiyama |
| 2009/0167974 | A1 | 7/2009 | Choi et al. |
| 2011/0147734 | A1* | 6/2011 | Kim et al. ........................ 257/43 |

(Continued)

FOREIGN PATENT DOCUMENTS

| JP | 2005-236010 A | 9/2005 |
| JP | 2011-159908 A | 8/2011 |

(Continued)

OTHER PUBLICATIONS

Kidchob et al., "Hafnia sol-gel films synthesized from HfCl4: Changes of structure and properties with the firing temperature," J Sol-Gel Sci Techn (2007) 42:89-93.*

*Primary Examiner* — A. Sefer
(74) *Attorney, Agent, or Firm* — Innovation Counsel LLP

(57) ABSTRACT

Provided are a thin-film transistor (TFT), a method of manufacturing the same, and a method of manufacturing a backplane for a flat panel display (FPD). The method of manufacturing the TFT according to an embodiment of the present invention includes forming a gate electrode on a substrate; forming an insulating layer on the substrate to cover the gate electrode; performing a plasma treatment on an upper surface of the insulating layer using a halogen gas; forming an oxide semiconductor layer on the insulating layer and positioned to correspond to the gate electrode; and forming source and drain electrodes on the insulating layer to contact and over portions of the oxide semiconductor layer.

9 Claims, 6 Drawing Sheets

(51) Int. Cl.
*H01L 29/66* (2006.01)
*H01L 29/49* (2006.01)

(56) References Cited

U.S. PATENT DOCUMENTS

| | | | |
|---|---|---|---|
| 2011/0186853 A1 | 8/2011 | Terai et al. | |
| 2011/0284848 A1* | 11/2011 | Yamazaki | 257/57 |
| 2011/0291096 A1 | 12/2011 | Ryoo et al. | |
| 2014/0113408 A1* | 4/2014 | Yamazaki | 438/104 |
| 2014/0273340 A1* | 9/2014 | Van Duren et al. | 438/104 |

FOREIGN PATENT DOCUMENTS

| | | |
|---|---|---|
| KR | 10-2009-0069806 A | 7/2009 |
| KR | 10-2009-0071358 A | 7/2009 |
| KR | 10-2011-0027470 A | 3/2011 |
| KR | 10-2011-0130896 A | 12/2011 |
| KR | 10-2012-0074760 A | 7/2012 |

* cited by examiner

THIN-FILM TRANSISTOR, METHOD OF MANUFACTURING THE SAME, AND METHOD OF MANUFACTURING BACKPLANE FOR FLAT PANEL DISPLAY

RELATED APPLICATIONS

This application claims the benefit of Korean Patent Application No. 10-2013-0088971, filed on Jul. 26, 2013, in the Korean Intellectual Property Office, the disclosure of which is incorporated herein by reference in its entirety.

BACKGROUND

1. Field

One or more embodiments of the present invention relate generally to flat panel displays. More specifically, one or more embodiments relate to a thin-film transistor, a method of manufacturing the same, and a method of manufacturing a backplane for a flat panel display.

2. Description of the Related Art

In recent years, as interest in information displays and demand for portable information media increase, research and commercialization has centered on light and thin flat panel displays (FPDs) that are replacing cathode ray tubes (CRTs) as commonly accepted display devices.

Since organic light-emitting displays (OLEDs), one type of FPDs, are self-luminous type FPDs, OLEDs tend to have good viewing angle and contrast ratio, as compared to liquid crystal displays (LCDs). Also, OLEDs do not need a backlight, and thus may be light and thin as compared to LCDs. OLEDs are also advantageous in terms of power consumption. Furthermore, OLEDs are advantageous in that they may be driven with a direct-current low voltage, and have high response rates. OLEDs are also advantageous in terms of manufacturing costs.

Recent efforts have focused on enlarging the display area of OLEDs. To this end, it is necessary to develop, as driving transistors for the OLED, thin-film transistors (TFTs) which have constant current characteristics, to ensure stable operation and durability. Oxide semiconductors have a higher mobility than silicon semiconductors, and TFTs using oxide semiconductors are thus being increasingly utilized.

SUMMARY

One or more embodiments of the present invention provide a thin-film transistor including an oxide semiconductor, and a method of manufacturing the same.

Additional aspects will be set forth in part in the description which follows and, in part, will be apparent from the description, or may be learned by practice of the presented embodiments.

According to one or more embodiments of the present invention, a method of manufacturing a thin-film transistor (TFT) includes: forming a gate electrode on a substrate; forming an insulating layer on the substrate to cover the gate electrode; performing a plasma treatment on an upper surface of the insulating layer, the plasma treatment using a halogen gas; forming an oxide semiconductor layer on the insulating layer and positioned to correspond to the gate electrode; and forming source and drain electrodes on the first insulating layer and over portions of the oxide semiconductor layer.

The halogen gas may include nitrogen fluoride ($NF_3$).

The insulating layer may include a high dielectric oxide film.

The insulating layer may include hafnium oxide ($HfO_x$).

The forming an insulating layer may include forming the first insulating layer by a sol-gel process.

The forming an insulating layer may further comprise performing the sol-gel process using a solution comprising hafnium chloride ($HfCl_4$) dissolved in a solvent that includes at least one of acetonitrile and ethylene glycol.

The method may further include annealing the insulating layer.

The oxide semiconductor layer may include an amorphous metal oxide.

The oxide semiconductor layer may include a zinc-tin oxide (ZTO).

The forming an oxide semiconductor layer may include forming the oxide semiconductor layer by spin coating or inkjet printing.

According to one or more embodiments of the present invention, a thin-film transistor (TFT) includes: a substrate; a gate electrode disposed on the substrate; an insulating layer disposed on the substrate to cover the gate electrode, the insulating layer having an upper surface that has been plasma-treated using a halogen gas; an oxide semiconductor layer disposed on the insulating layer and positioned to correspond to the gate electrode; and source and drain electrodes disposed on the insulating layer and over portions of the oxide semiconductor layer.

The halogen gas may include nitrogen fluoride ($NF_3$).

The insulating layer may include a high dielectric oxide film.

The insulating layer may include a hafnium oxide.

The oxide semiconductor layer may include an amorphous metal oxide.

The oxide semiconductor layer may include a zinc-tin oxide.

According to one or more embodiments of the present invention, a method of manufacturing a backplane for a flat panel display (FPD) includes: forming a gate electrode on a substrate; forming a first insulating layer on the substrate to cover the gate electrode; performing a plasma treatment on an upper surface of the first insulating layer, the plasma treatment using a halogen gas; forming an oxide semiconductor layer on the first insulating layer and positioned to correspond to the gate electrode; forming source and drain electrodes on the first insulating layer and over portions of the oxide semiconductor layer; forming a second insulating layer on the first insulating layer to cover the semiconductor layer and the source and drain electrodes, the second insulating layer including a first hole exposing the source and drain electrodes; and forming a pixel electrode on the second insulating layer and within the first hole.

BRIEF DESCRIPTION OF THE DRAWINGS

These and/or other aspects will become apparent and more readily appreciated from the following description of the embodiments, taken in conjunction with the accompanying drawings in which.

Figure 1:
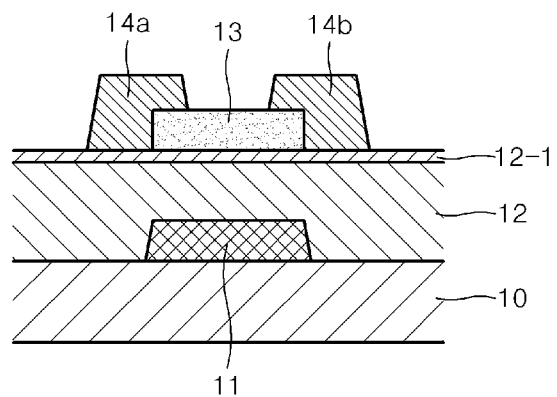
FIG. 1 is a schematic cross-sectional view illustrating an oxide thin-film transistor (TFT) according to an embodiment of the present invention.

The various figures are not necessarily to scale.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Since the present disclosure may have diverse modified embodiments, exemplary embodiments are illustrated in the drawings and are described in the detailed description of the invention. However, this does not limit the present disclosure within specific embodiments and it should be understood that the present disclosure covers all the modifications, equivalents, and replacements within the idea and technical scope of the present disclosure. Detailed descriptions related to well-known functions or configurations will be ruled out in order to clearly explain with respect to features of the embodiments of the present invention.

In the following description, the technical terms are used only for explain a specific exemplary embodiment while not limiting the present disclosure. The terms of a singular form may include plural forms unless referred to the context. The meaning of "include", "comprise", "have", "including", "comprising", or "having" specifies a property, a region, a fixed number, a step, a process, an element, a component and/or a combination of relevant constituent elements but does not exclude other properties, regions, fixed numbers, steps, processes, elements a component and/or a combination of relevant constituent elements.

It will be understood that although the terms "first", "second" and the like are used herein to describe various elements, these elements should not be limited by these terms. Terms such as these are only used to distinguish one component or element from other components or elements.

It will also be understood that when a layer (or film), a region, or a component is referred to as being 'on' another element, it can be directly on the other element, or intervening layers, regions, or components may also be present.

Exemplary embodiments of the present invention will be described below in more detail with reference to the accompanying drawings.

FIG. 1 is a schematic cross-sectional view illustrating an oxide thin-film transistor (TFT) according to an embodiment of the present invention. Referring to FIG. 1, the oxide TFT according to this embodiment of the present invention includes a substrate 10, a gate electrode 11 disposed on the substrate 10, a first insulating layer 12 which is disposed on the substrate 10 to cover the gate electrode 11 and of which an upper surface 12-1 is plasma-treated by using a halogen gas, an oxide semiconductor layer 13 disposed on the first insulating layer 12 to face the gate electrode 11, and a source electrode 14a and a drain electrode 14b disposed on the first insulating layer 12 to contact portions of the oxide semiconductor layer 13.

Figure 2:
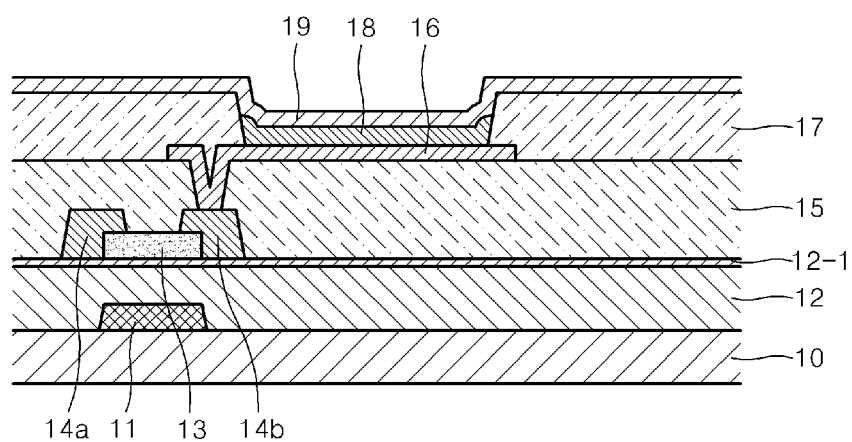
FIG. 2 is a schematic cross-sectional view illustrating a backplane for a flat panel display (FPD), according to an embodiment of the present invention.

FIG. 2 is a schematic cross-sectional view illustrating a backplane for a flat panel display (FPD) according to an embodiment of the present invention. Referring to FIG. 2, the backplane for an FPD according to an embodiment of the present invention includes the oxide TFT illustrated in FIG. 1; a second insulating layer 15 disposed on the first insulating layer 12 to cover the oxide semiconductor layer 13 as well as the source and drain electrodes 14a and 14b, the second insulating layer 15 including a hole exposing the source electrode 14a or the drain electrode 14b; and a pixel electrode 16 disposed on the second insulating layer 15 and within the hole in the second insulating layer 15.

Referring to FIG. 2, the backplane for the FPD, according to this embodiment of the present invention, further includes a third insulating layer 17 disposed on the second insulating layer 15 to cover an edge of the pixel electrode 16, an intermediate layer 18 including an emission layer and being disposed on that portion of the pixel electrode 16 which is exposed by an opening in the third insulating layer 17, and an opposite electrode 19 facing the pixel electrode 16 with the intermediate layer 18 interposed therebetween.

FIGS. 3 to 8 are schematic cross-sectional views illustrating a manufacturing method for the oxide TFT of embodiments of the present invention.

Figure 3:
FIGS. 3 to 8 are schematic cross-sectional views illustrating a manufacturing method of an oxide TFT, according to an embodiment of the present invention.

First, as illustrated in FIG. 3, a substrate 10 is provided. The substrate 10 may be formed of a transparent glass material mainly composed of $SiO_2$. However, the substrate 10 is not limited thereto, and thus the substrate 10 may be formed from various other materials such as an opaque material, a plastic material, or a metal material.

An auxiliary layer (not shown), such as a barrier layer, a blocking layer, and/or a buffer layer, may be provided on the substrate 10 so as to prevent impurity ions from diffusing through the substrate 10 and water or ambient air from infiltrating thereinto, as well as to planarize the surface of the substrate 10. The auxiliary layer may be formed using $SiO_2$ and/or $SiN_x$ through various deposition methods, such as plasma-enhanced chemical vapor deposition (PECVD), atmospheric pressure CVD (APCVD), and low pressure CVD (LPCVD). The auxiliary layer, however, may be omitted.

Figure 4:
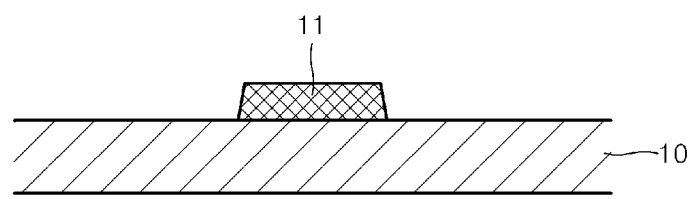

Referring to FIG. 4, a gate electrode 11 is formed on the substrate 10. To form the gate electrode 11, a metal layer may be laminated on the substrate 10 and then selectively etched. However, formation of the gate electrode 11 is not limited to this method. For example, the gate electrode 11 may alternatively be formed by patterning through a masking process which uses a lift-off process.

The gate electrode 11 may be formed of a conductive material. For example, the gate electrode 11 may include at least one material selected from silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), molybdenum-tungsten (MoW), and copper (Cu). However, the material of the gate electrode 11 is not limited thereto, and thus the gate electrode 11 may be formed of any conductive material, such as that containing metal, or the like.

Figure 5:
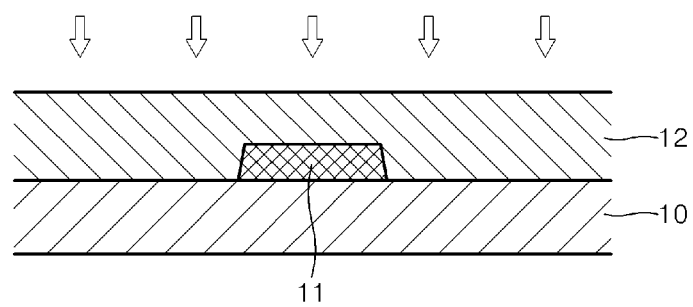

As illustrated in FIG. 5, a first insulating layer 12 is formed on the substrate 10 to cover the gate electrode 11. The first insulating layer 12 may function as a gate insulating layer disposed between the gate electrode 11 and an oxide semiconductor layer 13 (that will be described later) to insulate the gate electrode 11 from the oxide semiconductor layer 13.

The first insulating layer 12 may be formed by various processes such as a chemical vapor deposition method like CVD or PECVD, by a physical vapor deposition (PVD) method such as sputtering, or by a sol-gel process such as spin coating or inkjet printing.

The first insulating layer 12 may be formed of an inorganic substance, such as silicon oxide or silicon nitrogen. However, the first insulating layer 12 may include a high dielectric oxide film such as a hafnium oxide or an aluminum oxide. For example, the hafnium oxide may include HfAlO, HfLaO, $HfO_2$, HfON, HfSiO, or HfSiON.

For example, the first insulating layer 12 may be formed by a sol-gel process so that the first insulating layer 12 includes the above-described hafnium oxide. For example, the first insulating layer 12 may be formed by a sol-gel process using a solution in which hafnium chloride ($HfCl_4$) is dissolved in a solvent including at least one of acetonitrile and ethylene glycol.

As illustrated in FIG. 5, an upper surface of the first insulating layer 12 is plasma-treated using a halogen gas.

Figure 6:
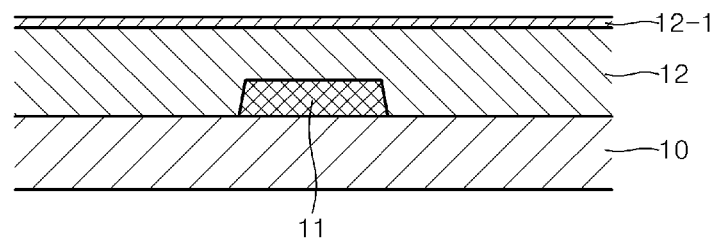

As illustrated in FIG. 6, the surface treatment layer 12-1 may be formed on an upper surface of the first insulating layer 12 by plasma treatment. When the oxide semiconductor layer 13 (that will be described below) is formed, components of the oxide semiconductor layer 13 may infiltrate into the first insulating layer 12. However, the surface treatment layer 12-1 may prevent these components from infiltrating or diffusing into the first insulating layer 12. Therefore, the oxide TFT may retain its superior characteristics. Also, such effects will be described with reference to FIGS. 9 and 12.

When the insulating layer is plasma-treated using a halogen gas, the halogen gas may include a halogen material. For example, the halogen gas may include nitrogen fluoride ($NF_3$). However, $NF_3$ is but one example of the halogen material, and the composition of the halogen gas is not limited thereto. For example, any halogen compounds (e.g. trichloride boron (BCl3), chloride hydrogen (HCl), phosphorus pentafluoride (PF5), carbon tetrafluoride (CF4), hydrogen fluoride (HF), chlorine ($Cl_2$), hydrogen bromide (HBr)) can be used.

Plasma treatment using an $NF_3$-including halogen gas may be accomplished at a power of 20 W, and a treatment time of 5, 10, or 30 s. $NF_3$ may be mixed together with O2 plasma, with a flow of 20 and 159 sccm.

An annealing process for the first insulating layer 12 may be further performed according to an embodiment of the present invention. For example, the first insulating layer 12 may be annealed at a temperature ranging between about 100° C. and about 300° C.

Figure 7:
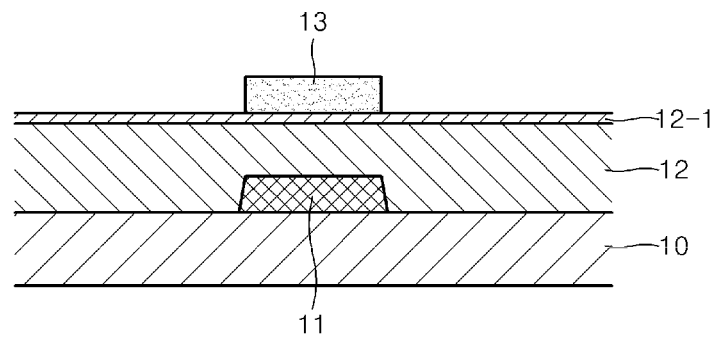

As illustrated in FIG. 7, the oxide semiconductor layer 13 may be formed on the first insulating layer 12 to face the gate electrode 11. The oxide semiconductor layer 13 may be positioned so as to face (i.e., positioned over, or overlapping) the gate electrode 11 with the insulating layer 12 disposed therebetween.

The oxide semiconductor layer 13 may include an amorphous metal oxide. For example, the oxide semiconductor layer 13 may include oxide material selected from metal elements of Groups 12, 13, and 14, such as Zn, In, gallium (Ga), tin (Sn), cadmium (Cd), germanium (Ge), or Hf, and/or any combination thereof. However, this is merely an example, and thus a material of the oxide semiconductor layer 13 is not limited thereto. For example, the oxide semiconductor layer 13 may include zinc-tin oxide (ZTO).

The oxide semiconductor layer 13 may be formed by a sol-gel process. For example, the oxide semiconductor layer 13 may be formed by spin coating or inkjet printing.

Figure 8:
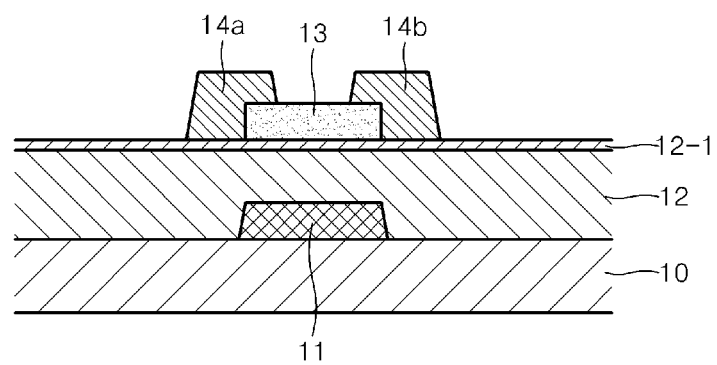

Referring to FIG. 8, source and drain electrodes 14a and 14b are formed on the first insulating layer 12 to contact a portion of the oxide semiconductor layer 13. In detail, the source and drain electrodes 14a and 14b may be formed on the surface treatment layer 12-1 that is formed on the first insulating layer 12, to partially overlap both the oxide semiconductor layer 13 and the surface treatment layer 12-1.

Referring to FIG. 8, a top surface of the oxide semiconductor layer 13 is not fully covered by the source and drain electrodes 14a and 14b, and the source and drain electrodes 14a and 14b are spaced apart from each other.

A metal layer may be laminated on the structure illustrated in FIG. 5 and then selectively etched in order to form the source and drain electrodes 14a and 14b. The etching process may include various processes, such as wet etching and dry etching. The metal layer may include at least one material selected from silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), molybdenum-tungsten (MoW), and copper (Cu). However, materials of the source and drain electrodes 14a and 14b are not limited thereto, and thus the source and drain electrodes 14a and 14b may be formed of any conductive material, such as that containing metal, or the like.

For example, the source and drain electrodes 14a and 14b may use a transparent conductive material or a conductive polymer such as an indium tin oxide (ITO) and an indium zinc oxide (IZO), and may have a multi-layered structure in which at least two conductive materials are laminated.

However, a method of forming the source and drain electrodes 14a and 14b will not be limited thereto. For example, the source and drain electrodes 14a and 14b may be patterned by a masking process which uses a lift-off process.

Although not shown, an additional insulating layer may be disposed between the oxide semiconductor layer 13 and the source and drain electrodes 14a and 14b.

By forming a second insulating layer 15, a pixel electrode 16, a third insulating layer 17, an intermediate layer 18, and an opposite electrode 19 on the structure of FIG. 8 in sequence, a backplane of a flat panel display (FPD) as illustrated in FIG. 2 may be obtained. The method of forming the above configuration on the structure of FIG. 8 to form the structure of FIG. 2 is as follows:

First, the second insulating layer 15 may be formed on the first insulating layer 12 to cover the oxide semiconductor layer 13 and the source and drain electrodes 14a and 14b. A first hole is then formed in the second insulating layer 15, by which the source and/or drain electrodes 14a and 14b are exposed. In detail, the second insulating layer 15 may be formed on the surface treatment layer 12-1 of the first insulating layer 12.

Thereafter, the pixel electrode 16 may be formed on the second insulating layer 15 and thus fill the first hole of the second insulating layer 15. The pixel electrode 16 may be in contact with the source and drain electrodes 14a and 14b through the first hole of the second insulating layer 15.

Afterwards, the third insulating layer 17 may be formed on the second insulating layer 15 to cover an edge of the pixel electrode 16, and may include an opening exposing at least one portion of the pixel electrode 16.

Then, the intermediate layer 18 having an emission layer may be formed on the portion of the pixel electrode 16 exposed by the opening. The opposite electrode 19 may be formed to face the pixel electrode 16, with the intermediate layer 18 interposed therebetween.

The second and third insulating layers 15 and 17 may be formed by a sol-gel process.

Referring to FIG. 2, the organic light-emitting diode may be provided with the pixel electrode 16, the intermediate layer 18, and the opposite electrode 19. Thus, a backplane for a flat panel display manufactured according to the embodiments of the present invention may be used as a backplane for the organic light-emitting display (OLED). However, the embodiments of the present invention are not limited to the configuration shown. For example, if liquid crystal is disposed between the pixel electrode 16 and the opposite electrode 19, the backplane for the flat panel display manufactured according to the embodiments of the present invention may be used as a backplane for a liquid crystal display.

Figure 9:
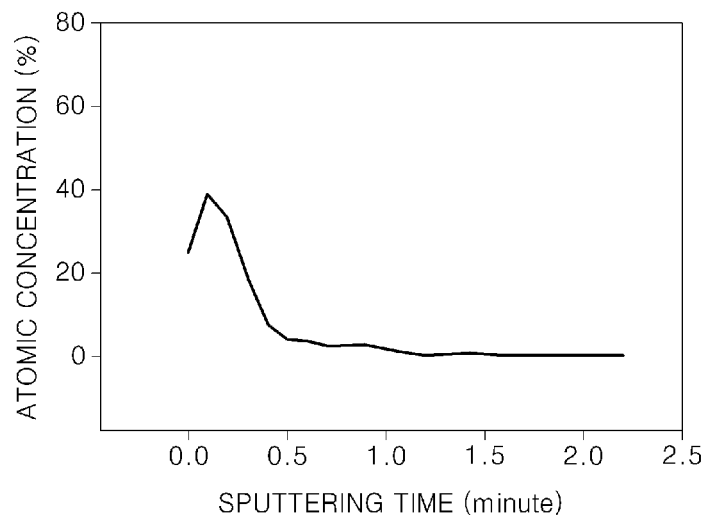
FIGS. 9 and 10 are graphs illustrating a sputtering depth profile of zinc (Zn)
Figure 10:
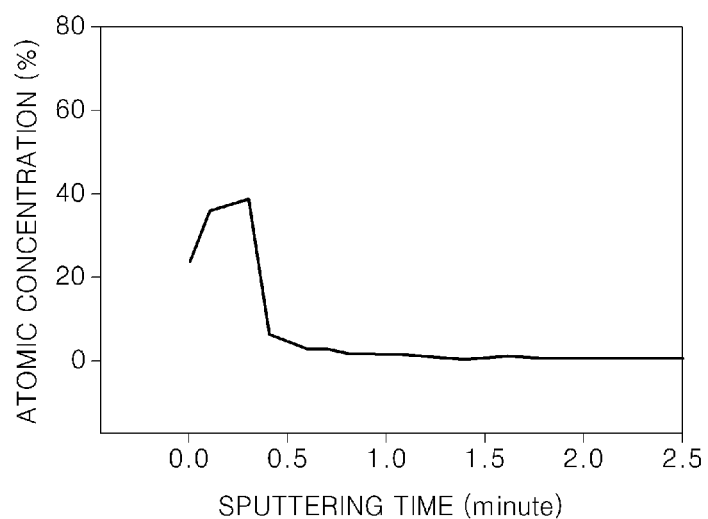

FIGS. 9 and 10 are graphs illustrating a sputtering depth profile of zinc, from which a change in zinc concentration depending on a depth from the target surface may be observed through the relationship of zinc concentration versus a sputtering time, when zinc is supplied to the target by a sputtering method. In detail, FIGS. 9 and 10 are graphs illustrating a sputtering depth profile of zinc in the substrate 10 on which the oxide semiconductor layer 13 is formed. In particular, FIGS. 9 and 10 are graphs illustrating a sputtering depth profile of a zinc component, when the oxide semiconductor layer 13 is formed of ZTO.

In detail, FIG. 9 illustrates an example in which the oxide semiconductor layer 13 is formed on the first insulating layer 12 without performing a plasma treatment on the upper surface of the first insulating layer 12. FIG. 10 illustrates an example in which the upper surface of the first insulating layer 12 is plasma-treated using a halogen material, for example $NF_3$, to form the surface treatment layer 12-1, and then the oxide semiconductor layer 13 is formed on the surface treatment layer 12-1. For FIG. 10, plasma treatment occurred at a power of 20 W, a treatment time of 10 s, $NF_3$ mixed-O2 plasma, with a flow of 159 sccm.

In FIGS. 9 and 10, the abscissa axis in the graph represents a time spent in performing sputtering of the oxide semiconductor layer 13 upon the first insulating layer 12. In the sputtering depth profile graph, the sputtering time is proportional to a depth from the surface of the target, as the thickness of oxide semiconductor layer 13 continually increases during sputtering. Therefore, the sputtering time is proportional to a depth from the oxide semiconductor layer 13 in FIGS. 9 and 10. In FIGS. 9 and 10, the ordinate axis in the graph represents the percentage of zinc atoms with respect to all the atoms.

In the depth profile graph as illustrated in FIGS. 9 and 10, if component concentration sharply changes, it may mean that there is an interface between two layers. In FIGS. 9 and 10, an area where the zinc concentration sharply decreases may be considered as an interface between the oxide semiconductor layer 13 and the first insulating layer 12.

In comparing the graphs of FIGS. 9 and 10, the slope of zinc concentration at the interface between the oxide semiconductor layer 13 and the first insulating layer 12 is steeper in the graph of FIG. 10 than in the graph of FIG. 9. That is, in FIG. 10, zinc penetrates less into the first insulating layer 12 due to the surface treatment layer 12-1 formed by performing a plasma treatment on the upper surface of the first insulating layer 12.

Figure 11:
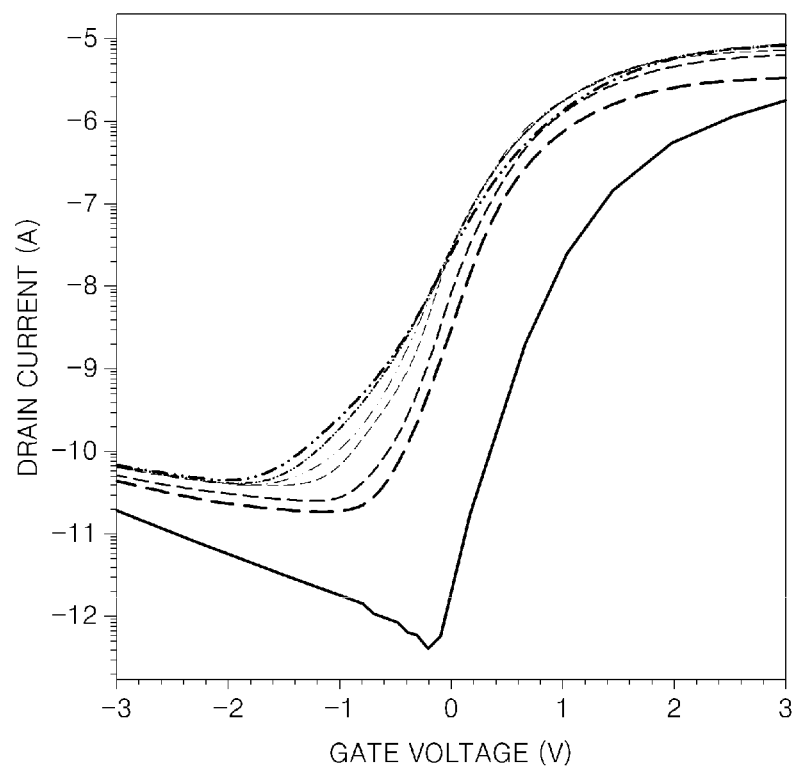
FIGS. 11 and 12 are graphs illustrating a voltage-current characteristic of the oxide TFT.
Figure 12:
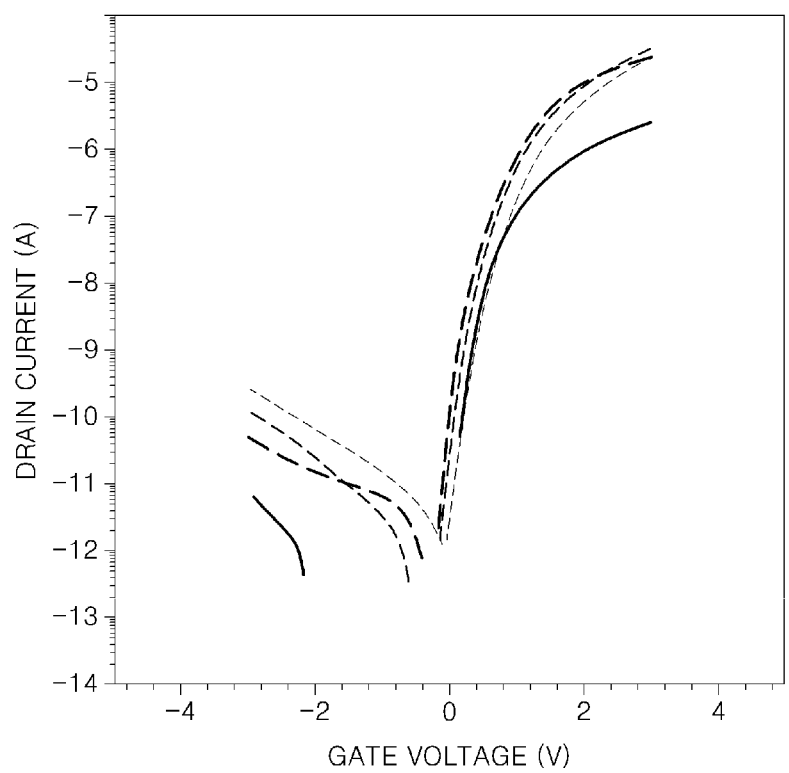

FIGS. 11 and 12 are graphs illustrating voltage-current characteristics of an oxide TFT constructed according to embodiments of the invention. In detail, FIG. 11 is a graph illustrating the voltage-current characteristics of the oxide TFT which is formed on the first insulating layer 12 without performing a plasma treatment on the upper surface of the first insulating layer 12. FIG. 12 is a graph illustrating the voltage-current characteristics of the oxide TFT in which the upper surface of the first insulating layer 12 is plasma-treated using a halogen material to form the surface treatment layer 12-1. For FIG. 12, plasma treatment occurred at a power of 20 W, a treatment time of 10 s, $NF_3$ mixed-O2 plasma, with a flow of 159 sccm.

A plurality of curves in FIGS. 11 and 12 represent voltage-current characteristics measured under environments with different bias voltages. Referring to FIGS. 11 and 12, the voltage-current characteristic of the oxide TFT slightly shifts according to changes in bias voltage in FIG. 11. On the contrary, in FIG. 12, the voltage-current characteristic of the device is relatively stably maintained, even if the bias voltage changes. Also, the voltage-current characteristic at a threshold voltage illustrated in FIG. 12 is superior to that in FIG. 11.

That is, the upper surface of the first insulating layer 12 is plasma-treated to form the surface treatment layer 12-1 to have excellent interface characteristics between the oxide semiconductor layer 13 and the first insulating layer 12, thereby improving device characteristics.

A masking process performed to form a backplane for the oxide TFT and the FPD as described above may be performed by dry etching or wet etching. Also, although only one transistor is illustrated in the figures for explaining the backplane for the FPD according to embodiments of the present invention for convenience of description, the embodiments of the present invention are not limited thereto. For example, the backplane for the FPD according to embodiments of the present invention may include a plurality of transistors unless the number of masking processes according to the embodiment of the present invention increases.

As described above, according to the one or more of the above embodiments of the present invention, it is possible to provide an oxide TFT having more stable device characteristics.

While various embodiments of the present invention have been particularly shown and described with reference to exemplary embodiments thereof, it will be that various changes in form and details may be made therein without departing from the spirit and scope of the embodiments of the present invention as defined by the following claims.

It should be understood that the exemplary embodiments described therein should be considered in a descriptive sense only, and not for purposes of limitation. Descriptions of features or aspects within each embodiment should typically be considered as available for other similar features or aspects in other embodiments. That is, various features of the various embodiments described can be mixed and matched to form other embodiments.

While one or more embodiments of the present invention have been described with reference to the figures, it will be understood by those of ordinary skill in the art that various changes in form and details may be made therein without departing from the spirit and scope of the embodiments of the present invention as defined by the following claims.

What is claimed is:

1. A method of manufacturing a thin-film transistor (TFT), the method comprising:
    forming a gate electrode on a substrate;
    forming an insulating layer on the substrate to cover the gate electrode;
    performing a plasma treatment on an upper surface of the insulating layer, the plasma treatment using a halogen gas;
    forming an oxide semiconductor layer on the insulating layer and positioned to correspond to the gate electrode; and
    forming source and drain electrodes on the insulating layer and over portions of the oxide semiconductor layer;
    wherein the forming an insulating layer comprises forming the insulating layer by a sol-gel process using a solution comprising hafnium chloride ($HfCl_4$) dissolved in a solvent that includes at least one of acetonitrile and ethylene glycol.

2. The method of claim 1, wherein the halogen gas comprises nitrogen fluoride ($NF_3$).

3. The method of claim 1, wherein the insulating layer comprises a high dielectric oxide film.

4. The method of claim 3, wherein the insulating layer comprises hafnium oxide ($HfO_x$).

5. The method of claim 1, further comprising annealing the insulating layer.

6. The method of claim 1, wherein the oxide semiconductor layer comprises an amorphous metal oxide.

7. The method of claim 6, wherein the oxide semiconductor layer comprises zinc-tin oxide (ZTO).

8. The method of claim 1, wherein the forming an oxide semiconductor layer comprises forming the oxide semiconductor layer by spin coating or inkjet printing.

9. A method of manufacturing a backplane for a flat panel display (FPD), the method comprising:
- forming a gate electrode on a substrate;
- forming a first insulating layer on the substrate to cover the gate electrode;
- performing a plasma treatment on an upper surface of the first insulating layer, the plasma treatment using a halogen gas;
- forming an oxide semiconductor layer on the first insulating layer and positioned to correspond to the gate electrode;
- forming source and drain electrodes on the first insulating layer and over portions of the oxide semiconductor layer;
- forming a second insulating layer on the first insulating layer to cover the oxide semiconductor layer and the source and drain electrodes, the second insulating layer comprising a first hole exposing one of the source and drain electrodes; and
- forming a pixel electrode on the second insulating layer and within the first hole;
- wherein the forming a first insulating layer comprises forming the first insulating layer by a sol-gel process using a solution comprising hafnium chloride ($HfCl_4$) dissolved in a solvent that includes at least one of acetonitrile and ethylene glycol.

* * * * *